United States Patent [19]
Oki et al.

[11] Patent Number: 4,972,489
[45] Date of Patent: Nov. 20, 1990

[54] SOUND REPRODUCING APPARATUS

[75] Inventors: Shinichi Oki; Toshihiko Ohashi, both of Hirakata; Fumiyasu Konno, Osaka; Hiroshi Yagi, Neyagawa; Takahiro Nakauma, Moriguchi, all of Japan

[73] Assignee: Matsushita Electric Industrial Co., Ltd., Kadoma, Japan

[21] Appl. No.: 411,209

[22] Filed: Sep. 21, 1989

Related U.S. Application Data

[63] Continuation of Ser. No. 158,521, Feb. 19, 1988, abandoned.

[30] Foreign Application Priority Data

Feb. 19, 1987 [JP] Japan .................................. 62-36068
Feb. 19, 1987 [JP] Japan .................................. 62-36070

[51] Int. Cl.$^5$ .............................................. H03G 5/00
[52] U.S. Cl. ........................................ 381/97; 381/98; 381/103; 381/86; 333/28 T
[58] Field of Search ............... 381/24, 62, 63, 97, 381/98, 103, 86; 333/28 R, 28 T

[56] References Cited

U.S. PATENT DOCUMENTS

| | | | |
|---|---|---|---|
| 3,980,828 | 9/1976 | Orban | 381/63 |
| 3,992,582 | 11/1976 | Osakabe | 381/63 |
| 4,329,544 | 5/1982 | Yamada | 381/86 |
| 4,472,993 | 9/1984 | Futamase et al. | 84/DIG. 4 |
| 4,594,730 | 1/1986 | Rosen | 381/18 |
| 4,612,530 | 9/1986 | Kurth et al. | 381/86 |
| 4,622,691 | 11/1986 | Tokumo et al. | 381/86 |

*Primary Examiner*—Forester W. Isen
*Attorney, Agent, or Firm*—Cushman, Darby & Cushman

[57] ABSTRACT

A sound reproduction system suitable for automobile, the reproduction system having a band-pass filter, a phase-shifter for shifting the output of the band-pass filter and a mixer which mixes the output of the phase-shifter with the original audio signal at a suitable mixing ratio, whereby a low frequency standing wave which is generally produced in the small automobile room may be eliminated, thereby providing a desirable frequency response characteristic.

8 Claims, 14 Drawing Sheets

Direct wave

FIG.7(b)

Reflected wave

FIG.7(c)

Listened wave

FIG.8(a)

Direct wave

FIG.8(b)

Reflected wave

FIG.8(c)

Phase-shifted wave

FIG.8(d)

Listened wave

SOUND REPRODUCING APPARATUS

This is a continuation of application Ser. No. 07/158,521, filed Feb. 19, 1988, which was abandoned upon the filing hereof.

FIELD OF THE INVENTION AND RELATED ART STATEMENT

1. Field of the Invention

The present invention relates to a sound reproducing apparatus, and more particularly to a sound reproducing apparatus such as a Hi-Fi sound system suitable for use in a small area such as of within an automobile.

2. Description of the Related Art

In recent years, the diffusion of sound within an automobile has improved remarkably, and in addition audio systems in the automobile have greatly advanced from the hitherto simple radio set or tape recorder to the present Hi-Fi systems for providing better Hi-Fi sound. However, since the area within the automobile coach is of a limited size, good sound is not obtainable in accordance with the conventional theory or principle of ordinary audio systems for use in ordinary homes.

Hereafter the problem of the conventional audio system when used in an automobile will be described.

Figure 1:
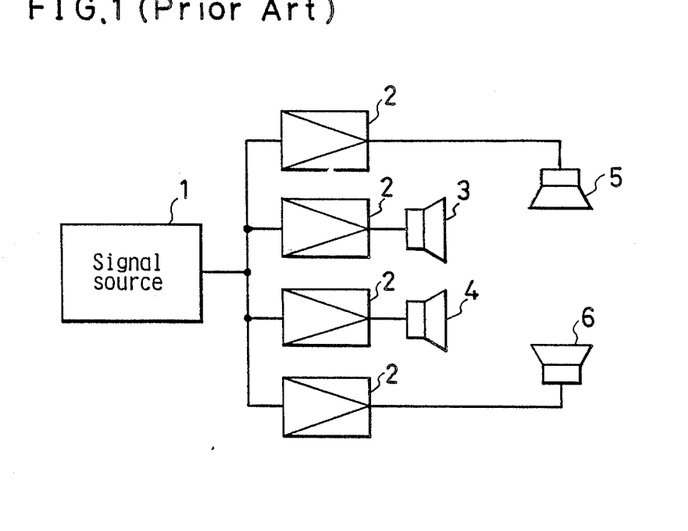
FIG. 1 is the circuit diagram of the conventional sound reproducing apparatus.

FIG. 1 shows one example of the conventional automobile audio set which comprises a signal source 1, such as a radio receiver set, a cassette tape player, or the like, amplifiers 2, 2, 2, 2 for amplifying signals from the signal source 1 and usually a plurality of loud speakers 3, 4, 5, 6. In such a conventional system, the audio signal from the audio signal source 1 is amplified by the amplifiers 2, 2, . . . and the amplified signals are reproduced by front side loud speakers 3 and 4 and back side loud speakers 5 and 6. The above-mentioned conventional system has the shortcoming of making a standing wave when the audio signal is reproduced as it is because of the smallness of the room size in the automobile. Namely, considerable peaks and dips of sound are made at listening points in the automobile room.

Figure 2:
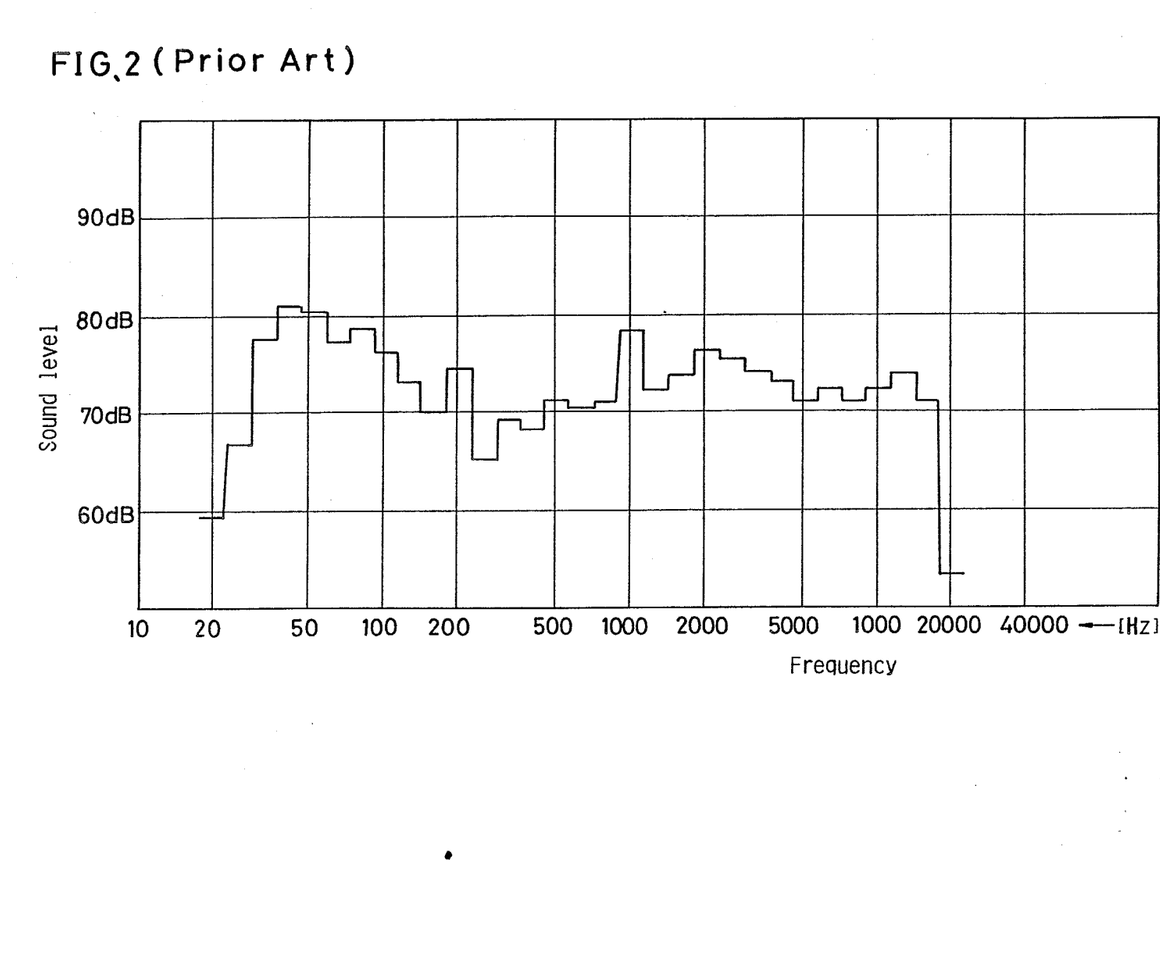
FIG. 2 is the measured frequency response diagram of the conventional sound reproducing apparatus of FIG. 1.

FIG. 2 is a graph showing a measured frequency response diagram of standing wave levels, wherein the curve shows that considerable peaks are produced at the parts of frequencies of about 200 Hz and about 1 KHz.

Figure 3:
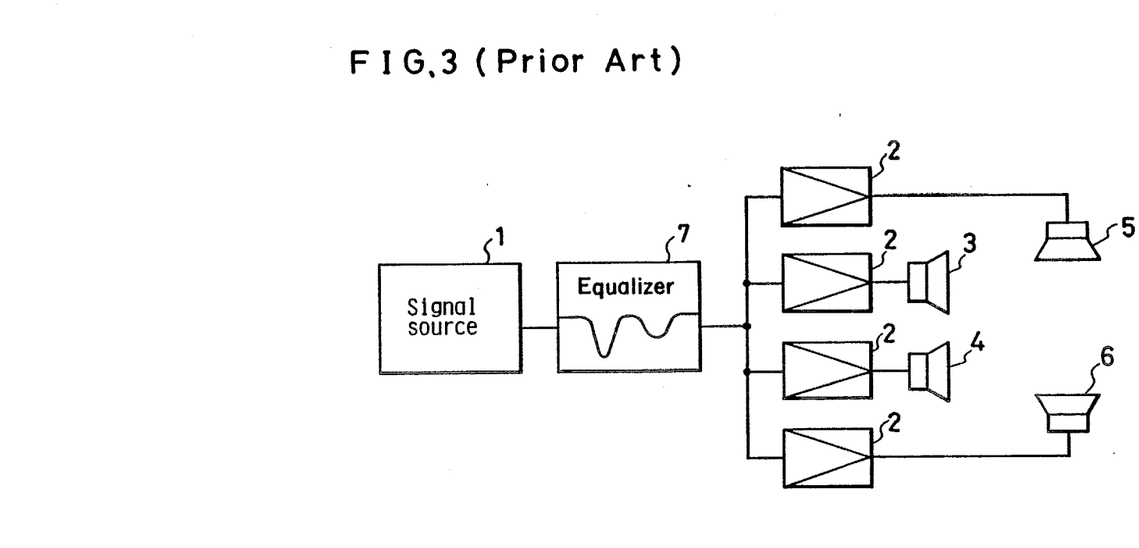
FIG. 3 is the circuit diagram of the conventional sound reproducing apparatus improved by providing an equalizer 7 intended to compensate the frequency response.

A conventional proposal for eliminating such peaks has been made, as shown in FIG. 3. In the conventional method, a frequency characteristic equalizer 7, having a reverse frequency response to the above-mentioned measured frequency characteristic in the automobile room, as shown in FIG. 2, is connected to the output of signal source 1. The audio signal is reproduced through such equalizer 7 so as to compensate the peaks and dips in the automobile room. Thereby, the output of the signal source 1 is provided through a fixed equalizer which compensates the signal level by 10 dB or higher to the amplifiers 2, 2 . . . , to drive speakers 3, 4, 5 and 6.

Figure 4:
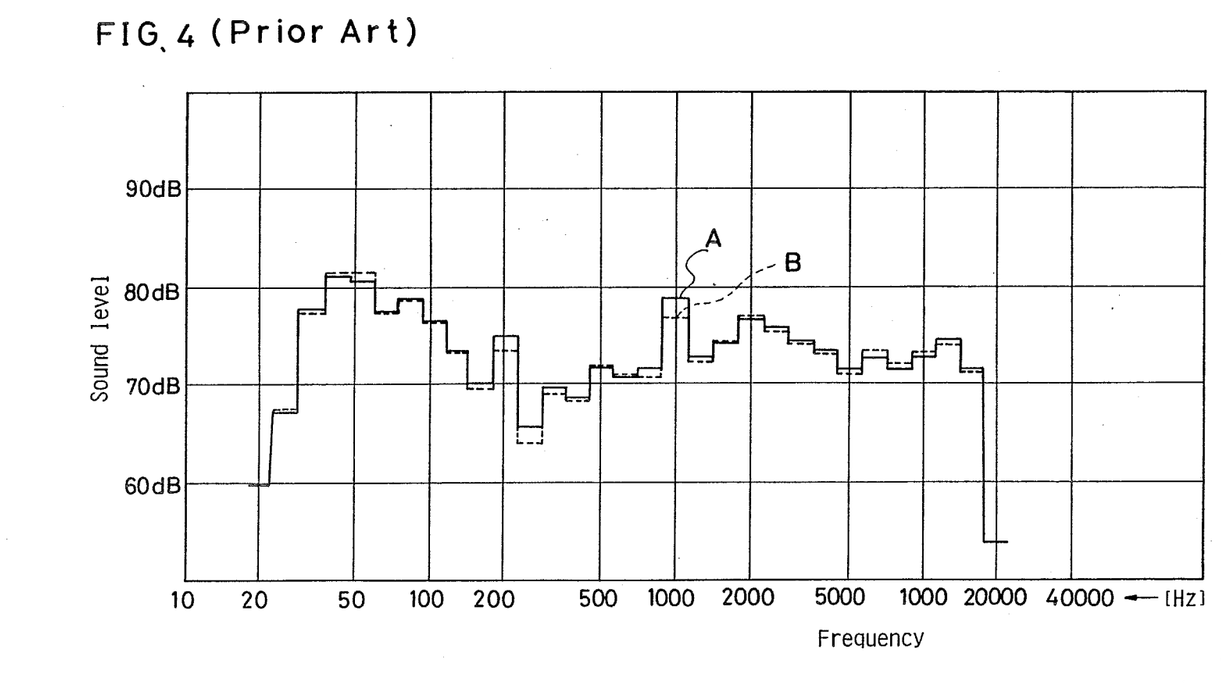
FIG. 4 is the measured frequency response diagram of the conventional sound reproducing apparatus of FIG. 3 compared with the apparatus of FIG. 1.

FIG. 4 shows a measured frequency characteristic at a listening point in the automobile room when the audio signal is reproduced by the audio system having the equalizer of FIG. 3, wherein solid line curve A shows the audio output level without the use of the equalizer and broken line curve B shows the audio signal level reproduced by using the equalizer having the reverse characteristics to the characteristics of FIG. 2. As is obvious from comparisons of the curves A and B, even though the electric signal is equalized by more than 10 dB by the equalizer 7, concerning the audio level measured at the listening point of the automobile room the improvement due to the use of the equalizer 7 is effective only to the level of about 3 dB. This is because the peaks and dips of sound level in the automobile room are made by the effect of resonation by standing waves in the room of such limited size, and no effective compensations of undesirable peaks and dips can be made only by using such an equalizer 7.

OBJECT AND SUMMARY OF THE INVENTION

In order to solve the above-mentioned problem, the sound reproducing system in accordance with the present invention mixes a phase-shifted component of the original audio signal with the original signal, and the mixed composite signal is then reproduced by a loud speaker.

Furthermore, by mixing the phase-shifted component of an original signal having a high frequency component with the original audio signal, an artificial echo is possible, thereby enabling the sound system to produce a sound of comfortable or dramatic feeling.

DESCRIPTION OF THE PREFERRED EMBODIMENTS

Figure 5:
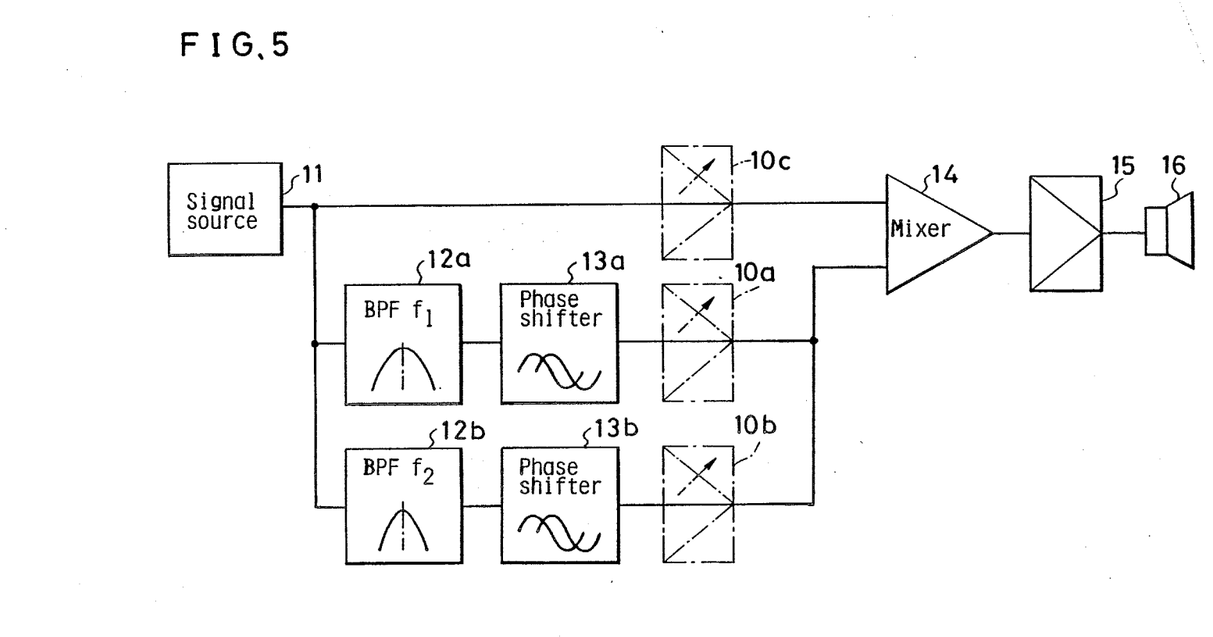
FIG. 5 is a circuit diagram of a first embodiment in accordance with the present invention.

Hereafter, a preferred embodiment of the present invention is elucidated with reference to the accompanying drawings of FIG. 5 and thereafter. The embodiment is described in the example wherein a loud speaker is provided on one side of a front seat (driver's seat), but the embodiment is also applicable to other cases where the loud speakers are provided on both sides of the front seat and/or on both sides of the back seat.

An audio signal to be reproduced is issued from a signal source 11, such as a radio receiver set, a cassette tape player or the like, is given to a first band-pass filter 12a having a first band-pass characteristic and a second band-pass filter 12b having a second band-pass characteristic in order to produce components of restricted frequency bands of the audio signal of respective desired ranges. In this example, the first band-pass filter 12a has a center frequency of 1.0 KHz and the second band-pass filter 12b has a center frequency of 200 Hz for compensation of undesirable peaks of reproduced sound at the listening points of 1.0 KHz and 200 Hz, respectively. Outputs of the band-pass filters 12a and 12b are given to phase-shifters 13a and 13b which give predetermined phase-shifts, respectively. The outputs of the phase-shifters 13a and 13b are given as inputs to a mixer 14 which also receives the output of the signal source 11. The ratio of respective signals to be mixed is selected by a desirable ratio determined by experimental search. In order to adjust the mixing ratio, adjustable attenuators 10a, 10b, 10c may be inserted before the input terminals of the mixer 14. The mixed output from the mixer 14 is then amplified by an amplifier 15, and the amplified sound signal is given to a loud speaker 16 which is provided, for instance, at a side part of a front seat on the inside face of a front door.

Figure 6:
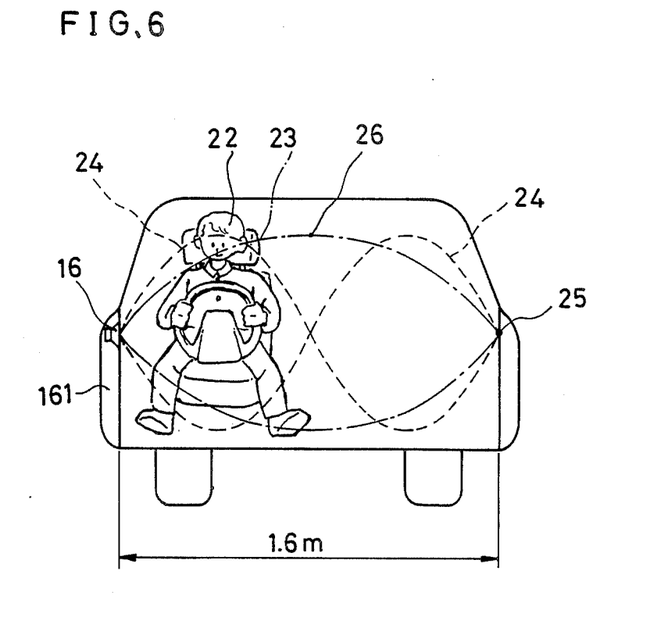
FIG. 6 is a schematic sectional front view of an automobile having the sound reproducing apparatus in accordance with the present invention showing the standing wave of the sound.

Compensation of the standing wave by the above-mentioned configuration will now be described. The standing wave is produced when a sound wave is issued in a space of a limited size, such as an automobile room wherein the sound wave makes resonance or anti-resonance as shown in FIG. 6, wherein the speaker 16 is provided on the inside face of the front door 161 at the side of the driver's seat. The curves 23 and 24 show the standing waves, wherein numeral 25 designates a node and 26 a loop. Provided that the width of the room of the automobile is about 1.6 m, the standing wave is produced when the wavelength of the sound wave is n/2 times of the width where n is 1, 2, ... (positive integer). In this embodiment, where the sound wave is of 200 Hz, for the integer n of n = 2, the standing wave having a frequency f (Hz) is produced as follows:

$$f = \frac{[\text{Speed of sound wave}]}{[\text{Width}]} = \frac{315 \, m/s}{1.6 \, m} = 200 \, \text{Hz}. \quad (1)$$

Figure 7A:
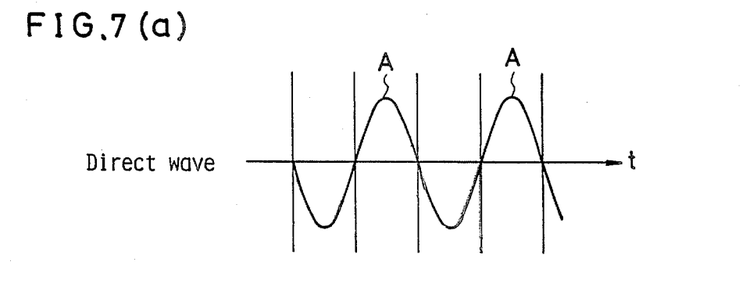
FIGS. 7(a)–(c) are time charts showing operation of the conventional sound reproducing apparatus of FIG. 1.
Figure 7B:
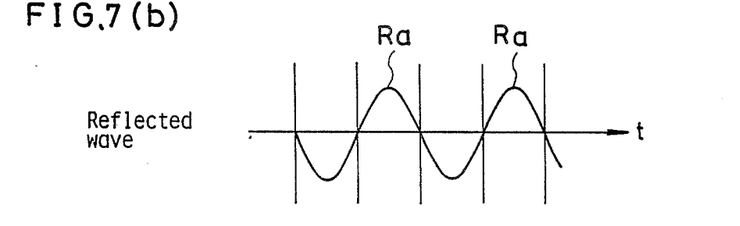
Figure 7C:
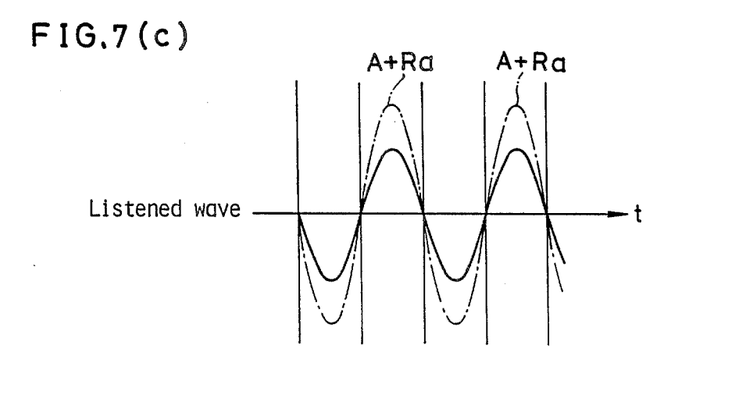

In such a conventional case, since the listening point for the driver 22 is on the part of the loop of the standing wave 24, the sound which is listened to by the driver consists of peaks of the standing wave for such frequency. That is, as shown in the waveform time chart of FIGS. 7(a)-(c), in the conventional sound reproducing system wherein phase-shifting is not made, peaks A of direct wave (a) from the loud speaker 16 and peaks Ra of reflected wave (b) are superposed thereby making a standing wave (c) of amplitude A+Ra, to be listened to by the listener 22. Therefore, during use of the conventional simple audio amplifier which only has a frequency characteristic equalizer 7 as shown in FIG. 3, the standing wave is always produced since the reflected wave is unavoidable. Therefore, sufficient compensation or correcton of the response characteristic is impossible.

Figure 8A:
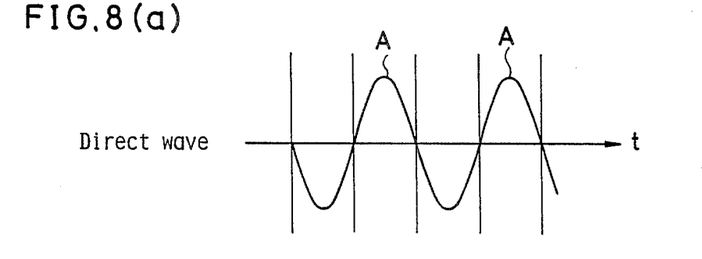
FIGS. 8(a)–(d) are time charts showing operation of the sound reproducing apparatus embodying the present invention.
Figure 8B:
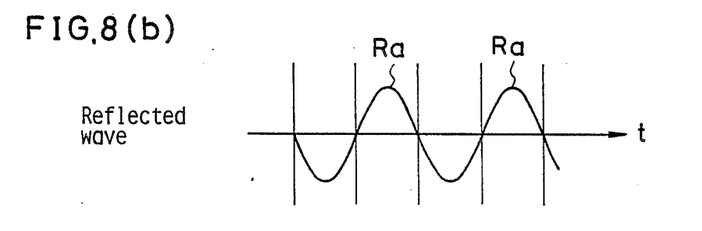
Figure 8C:
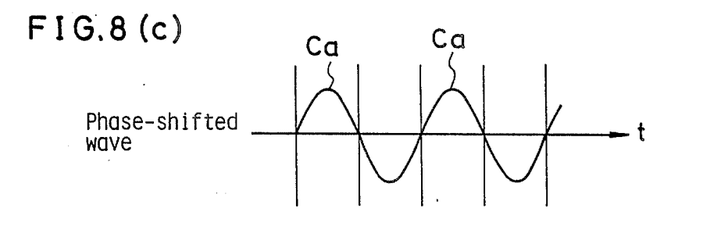
Figure 8D:
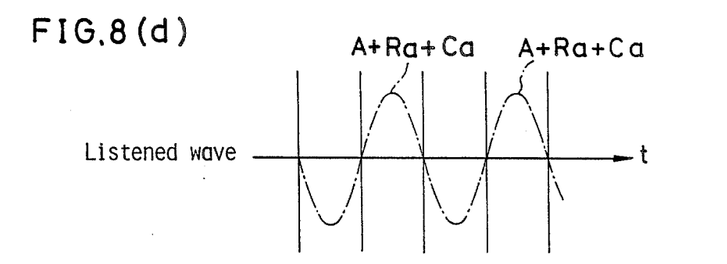

On the contrary, as shown in FIGS. 8(a)-(d), when an inversely phase-shifted sound wave (c), which has almost the inverse polarity to the original signal (a), is added to the direct sound wave (a), the resultant wave listened to by the driver becomes the sum of the direct wave (a), reflected wave (b) and a wave (c) based on a phase-shifted signal, thereby making the resultant sound wave an ideal waveform (d), which is substantially identical to the direct wave (a). In actual experiment using the embodiment, a good result is achieved when the phase-shifted signal (c) is made by shifting the signal from the signal source 11 by a phase shift of about 360°. Thus, a satisfactory resultant composite sound wave of (d) is made by summing wave (a) of the original audio signal, wave (b) of the reflected signal and wave (c) of the phase-shifted signal, as shown in FIG. 8(d).

According to the results of experimental research, compensation or corrections of the standing waves at 200 Hz and 1.0 KHz are necessary, as shown in FIG. 4. Therefore, phases of the signals of 1.0 KHz and 200 Hz are shifted by the phase-shifters 13a and 13b, respectively, thereby to produce a mixed signal for producing a corrected signal for the listener.

Figure 9:
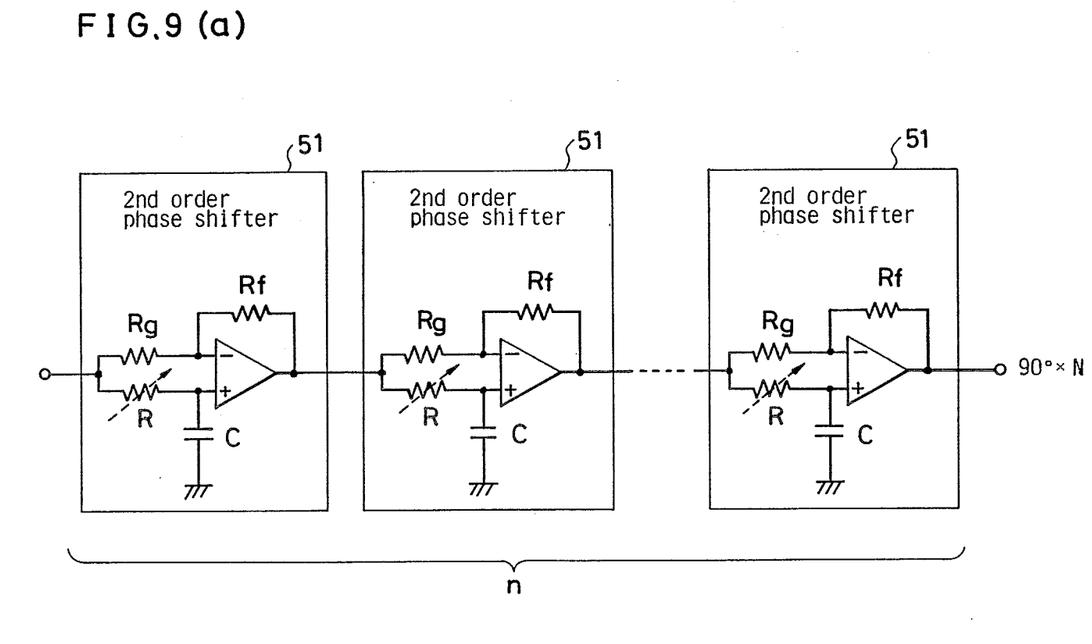
FIG. 9(a) is a circuit diagram of a multi-stage connection of 2nd order phase-shifters used in the embodiment of the present invention.
FIG. 9(b) is a characteristic diagram showing phase-shift vs. frequency of a single stage unit of the 2nd order phase-shifter.
Figure 9B:
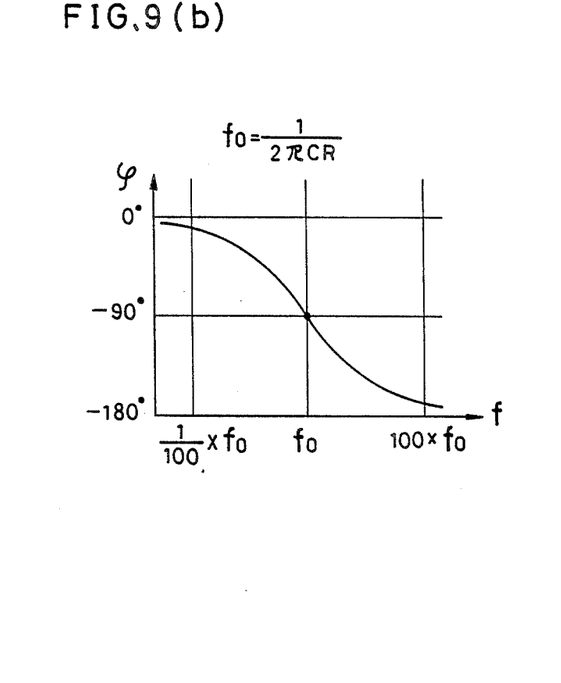

In actual use, the listening point is not necessarily at the loop or at node, and further, the number n of higher harmonics may be of various numbers, and hence, the phase-shift of the actual apparatus as well as the ratio of amplitudes of the mixed signals should be adjusted in actual use. The actual phase-shifter is preferably made by serially coupling plural states of known 2nd order phase-shifters 51 as shown in FIG. 9(a) to produce the desired phase-shift amount. In each second order phase-shifter 51, the phase-shifter per each unit can be adjusted from 0° to 180° by adjusting the resistor R. FIG. 9(b) shows the characteristic of each unit of the known 2nd order phase-shifter unit. In the embodiment, the plural 2nd order phase shifters for making 90° shift are connected serially.

Figure 10:
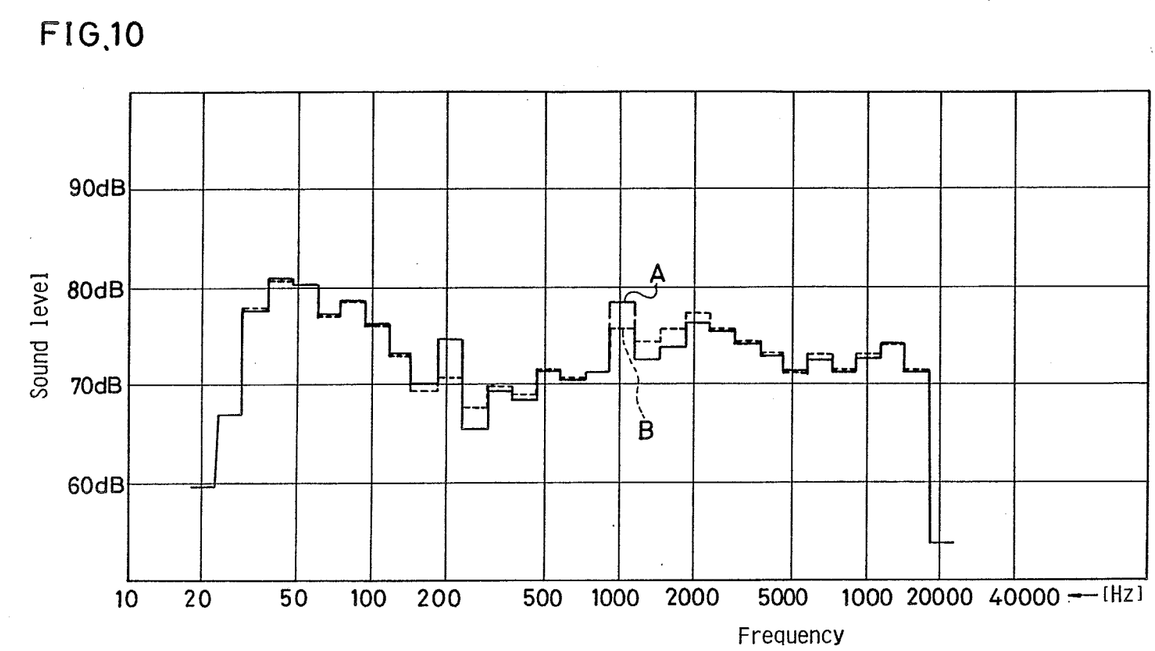
FIG. 10 is a measured frequency response characteristic diagram of the first embodiment in accordance with the present invention.

FIG. 10 shows the actually measured frequency characteristic graph of the preferred embodiment described with reference to FIG. 5 through FIG. 9 wherein the solid line curve A shows the characteristic of the conventional example, and the broken line curve B shows the characteristic of the present invention. As shown in FIG. 10, according to the present invention, the improvement of the frequency response characteristic is drastic contrasted to the conventional simple use of the equalizer, and the shape of the characteristic curve on both sides of peaks are satisfactorily smooth. In order to achieve the satisfactory improvement of frequency response characteristic, the ratio mixing of the phase-shifted signals and the direct signal are suitably selected for example, in the example of measurement of FIG. 10, the phase-shifted signal to be mixed has a level of −3 dB to the direct signal from the signal source 11.

Figure 11:
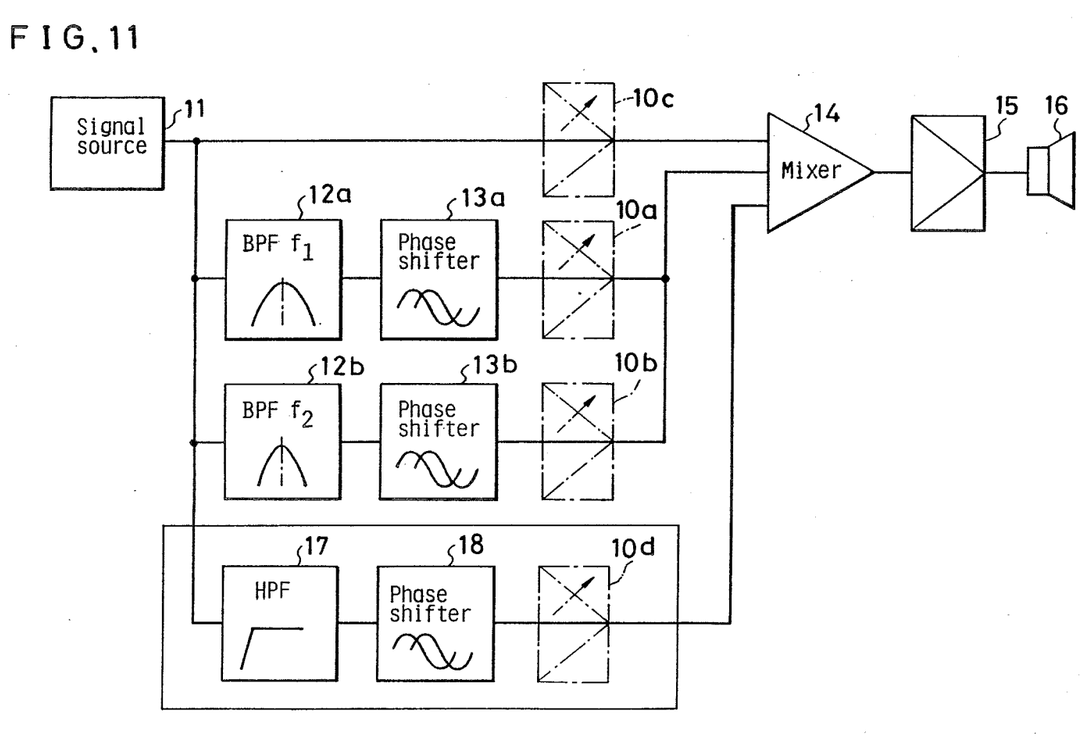
FIG. 11 is a circuit diagram of a second example in accordance with the present invention.

FIG. 11 shows a second embodiment of the invention. In this example, the similar or corresponding parts to the aforementioned first embodiment of FIG. 5 are designated by the same numerals or marks. This embodiment comprises, besides the configuration of FIG. 5, a circuit of a high pass filter 17, a phase shifter 18 and an optional variable attenuator 10d which are provided between the output terminal of the signal source 11 and a third input terminal of the mixer 14. By passing the audio signal from the signal source 11 through the high pass filter 17, a signal component which contains many portions for making echo-like sound is extracted. Therefore, by passing the output of the high pass filter 17 through the phase-shifter 18, and by mixing the phase-shifted component with the original audio signal from the signal source 11 and the phase-shifted signals from the phase-shifters 13a and 13b by means of the mixer 14, a comfortable sound having artificial echo sound is obtainable.

Figure 12:
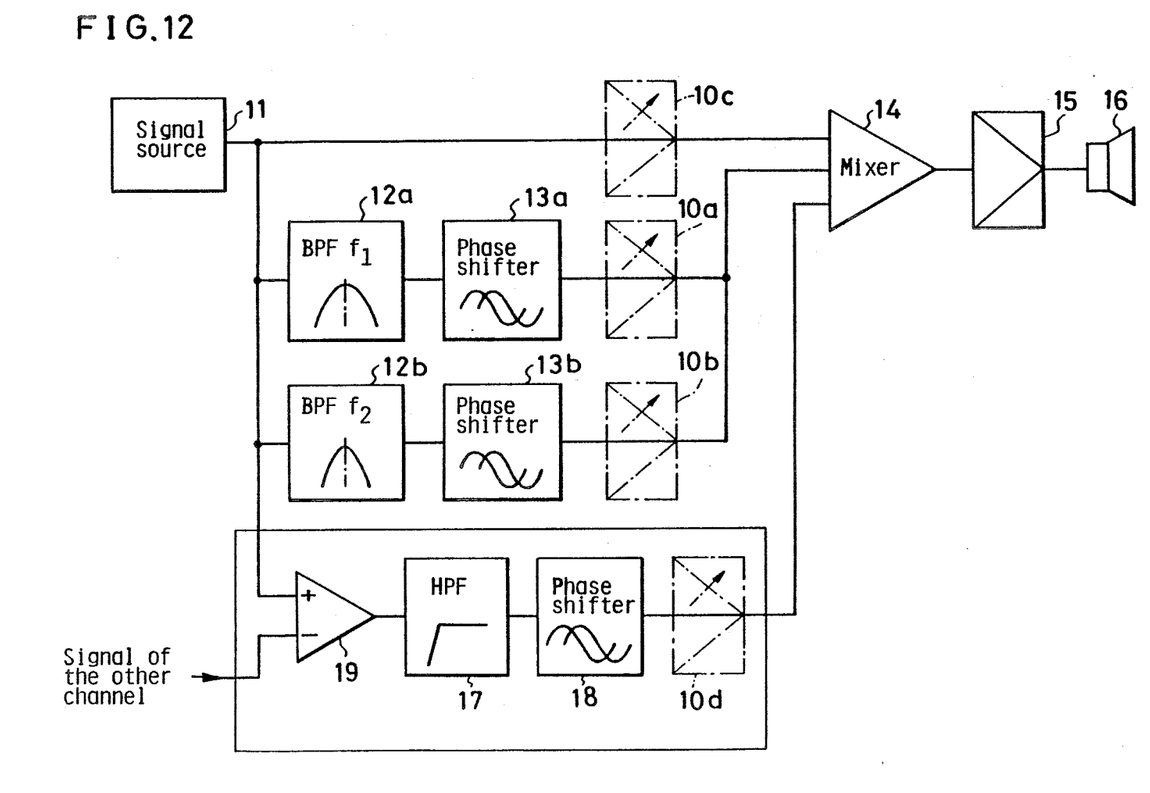
FIG. 12 is a circuit diagram of a third example in accordance with the present invention.

FIG. 12 shows a circuit diagram of a third embodiment which can make an echo-like signal like the second example of FIG. 11, but with better effect. In this example, the similar or corresponding parts are designated by the same numerals and marks as the foregoing examples. In this embodiment, the audio signal from the signal source 11 is impressed to the high pass filter 17 through a differential amplifier 19 which receives at its other input terminal an audio signal of the other channel of the audio signal from the signal source 11. As a result of the above-mentioned configuration of FIG. 12, a more realistic echo effect is obtainable, since the channel difference signal of a stereo signal generally includes many echo signal components in the high frequency range.

Figure 13:
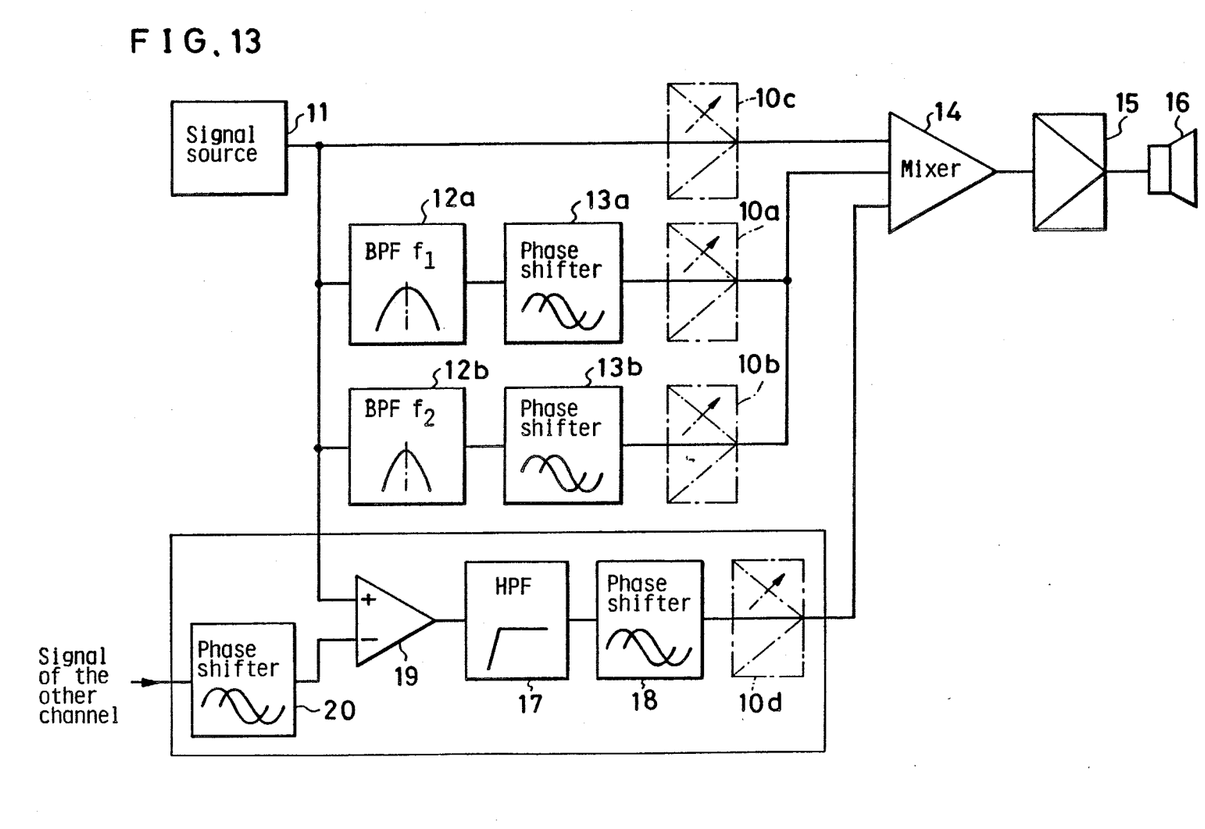
FIG. 13 is a circuit diagram of a fourth example in accordance with the present invention.

FIG. 13 shows a fourth embodiment. In this example, the similar or corresponding parts are designated by the same numerals and marks as the foregoing examples. In this fourth embodiment, a phase-shifter 20 is provided between the audio signal source 11 of the other channel and the other input terminal of the differential amplifier 19. By using the circuit of this fourth embodiment, even when the audio signal source, such as the radio receiver, cassette tape player, etc. are outputting only monaural audio signals, an artificial stereoscopic sound can be reproduced.

What is claimed is:

1. A sound reproduction system for a motor vehicle characterized by a room width, comprising:
   an audio signal source outputting an audio signal of a particular channel;
   a first band-pass filter having a first band-pass characteristic and receiving the audio signal of the channel from the audio signal source;
   a second band-pass filter having a second band-pass characteristic and receiving the audio signal of the channel from the audio signal source in parallel with said first band-pass filter;
   a first phase-shifter, connected to the first band-pass filter, for giving a first predetermined phase-shift on an output or the first band-pass filter;
   a second phase-shifter, connected to the second band-pass filter, for giving a predetermined phase-shift on an output of the second band-pass filter;
   mixer means for generating a mixed signal by mixing the output from the first phase shifter, the output from the second phase-shifter and the audio signal of the channel in a predetermined ratio; and
   a loud speaker connected to the mixer to output the mixed signal as a sound wave, whereby
   the first and second band-pass characteristics have center frequencies (f) according to the relation of:

$$f = (S/D) \times (n/2)$$

where:
   S = speed of the sound wave
   D = room width of the motor vehicle
   n = positive integer.

2. A sound reproduction system for a motor vehicle in accordance with claim 1, further including:
   adjustable attenuators connected between the phase-shifters and the mixer means and betrween the audio signal source and the mixer means.

3. A sound reproduction system for a motor vehicle in accordance with claim 1, further including:
   an amplifier connected between the mixer means and the loud speaker.

4. A sound reproduction system for a motor vehicle characterized by a room width, comprising:
   an audio signal source outputting an audio signal of a particular channel;
   a first band-pass filter having a first band-pass characteristic and receiving the audio signal of the channel from the audio signal source;
   a second band-pass filter having a second band-pass characteristic and receiving the audio signal of the channel from the audio signal source in parallel with said first band-pass filter;
   a first phase shifter connected to the first band-pass filter for giving a first predetermined phase-shift on an output of the first band-pass filter;
   a second phase-shifter connected to the second band-pass filter for giving a second predetermined phase-shift on an output of the second band-pass filter;
   high frequency component control means for selectively passing a high frequency component of the audio signal from the audio signal source and shifting the phase of the selectively passed high frequency component, the shifted high frequency component being output as a high frequency band signal;
   mixer means for generating a mixed signal by mixing the output from the first phase-shifter, the output from the second phase shifter, the high frequency band signal, and the audio signal of the channel in a predetermined ratio; and
   a loud speaker connected to the mixer to output the mixed signal as a sound wave, whereby
   the first and second band-pass characteristics have center frequencies (f) according to the relation of $$f = (S/D) \times (n/2)$$

where:
   S = speed of the sound wave
   D = room width of the motor vehicle
   n = positive integer.

5. A sound reproduction system for a motor vehicle in accordance with claim 4, further including:
   adjustable attenuators connected between the phase-shifters and the mixer means and between the audio signal source and the mixer means.

6. A sound reproduction system for a motor vehicle in accordance with claim 4, further including:
   an amplifier connected between the mixer means and the loud speaker.

7. A sound reproduction system in accordance with claim 4, wherein:
   said high frequency component control means includes means for producing a differential signal between said audio signal from said audio signal source and another signal of another channel outputted from said audio signal source which has been phase-shifted by a predetermined amount.

8. A sound reproduction system in accordance with claim 2, 3, 1, 5, 6, 4 or 7, wherein:
   said phase-shifters comprise at least one second order phase-shifter, respectively.

* * * * *